(12) United States Patent
Naidu et al.

(10) Patent No.: US 11,035,897 B2
(45) Date of Patent: Jun. 15, 2021

(54) METHOD AND DEVICE FOR FAULT SECTION IDENTIFICATION IN MULTI-TERMINAL MIXED LINES

(71) Applicant: ABB POWER GRIDS SWITZERLAND AG, Baden (CH)

(72) Inventors: Obbalareddi Demudu Naidu, Bangalore (IN); Neethu George, Bangalore (IN); Sachin Srivastava, Bangalore (IN); Swaroop Gajare, Bangalore (IN)

(73) Assignee: ABB Power Grids Switzerland AG, Baden (CH)

(*) Notice: Subject to any disclaimer, the term of this patent is extended or adjusted under 35 U.S.C. 154(b) by 0 days.

(21) Appl. No.: 16/636,544

(22) PCT Filed: Sep. 26, 2017

(86) PCT No.: PCT/IB2017/055831
§ 371 (c)(1),
(2) Date: Feb. 4, 2020

(87) PCT Pub. No.: WO2019/025840
PCT Pub. Date: Feb. 7, 2019

(65) Prior Publication Data
US 2020/0408827 A1    Dec. 31, 2020

(30) Foreign Application Priority Data
Aug. 4, 2017  (IN) .............................. 201741027822

(51) Int. Cl.
*G01R 31/08* (2020.01)
*H02H 1/00* (2006.01)
(Continued)

(52) U.S. Cl.
CPC ......... *G01R 31/086* (2013.01); *H02H 1/0007* (2013.01); *H02H 3/042* (2013.01); *H02H 3/265* (2013.01)

(58) Field of Classification Search
CPC .... G01R 31/086; H02H 1/0007; H02H 3/042; H02H 3/265; H02H 7/26; H02H 3/06
See application file for complete search history.

(56) References Cited

U.S. PATENT DOCUMENTS

2007/0156358 A1    7/2007  Saha et al.
2009/0150099 A1    6/2009  Balcerek et al.
(Continued)

FOREIGN PATENT DOCUMENTS

EP    0464662 A1    6/1991
EP    0464662 A1    1/1992

OTHER PUBLICATIONS

Ferreira, Gustavo D., et al., "Impedance-Based Fault Location for Overhead and Underground Distribution Systems", IEEE, 2012 North American Power Symposium (NAPS), Champaign, IL, USA, Sep. 9-11, 2012, 6 pages.

(Continued)

*Primary Examiner* — Adolf D Berhane
*Assistant Examiner* — Afework S Demisse
(74) *Attorney, Agent, or Firm* — Slater Matsil, LLP

(57) ABSTRACT

The invention provides a method and device for fault section identification in a multi-terminal mixed line. The method comprises obtaining positive sequence voltage and current phasors from measurements of voltages and currents at each terminal of the mixed line. The method further comprises calculating a voltage phasor for each terminal, wherein the calculation of the voltage phasor for a first terminal is performed using at least the voltage and current phasors obtained for one of a second terminal and a third terminal, and the current phasor obtained for the first terminal. Thereafter, the method comprises determining a section of the mixed line having the fault, based on comparison of the calculated and obtained voltage phasors for each terminal. In addition, the method comprises controlling a switching device with a re-trip signal generated based on the determination of the section with the fault.

8 Claims, 2 Drawing Sheets

(51) Int. Cl.
*H02H 3/04* (2006.01)
*H02H 3/26* (2006.01)

(56) References Cited

U.S. PATENT DOCUMENTS

| | | |
|---|---|---|
| 2010/0102824 A1 | 4/2010 | Tremblay et al. |
| 2017/0089971 A1 | 3/2017 | Xu et al. |
| 2017/0102426 A1* | 4/2017 | Schweitzer, III ...... G01R 31/11 |
| 2019/0041448 A1* | 2/2019 | Ha ........................ G01R 31/086 |
| 2020/0041562 A1* | 2/2020 | Naidu .................. G01R 31/083 |

OTHER PUBLICATIONS

International Preliminary Report on Patentability and Written Opinion for PCT/IB2017/055831, dated Feb. 4, 2020, 7 pages.
International Search Report for PCT/IB2017/055831, dated May 17, 2018, 4 pages.
Ferreira et al., "Impedance-Based Fault Location for Overhead and Underground Distribution Systems", IEEE, 2012, 6 pages.

\* cited by examiner

METHOD AND DEVICE FOR FAULT SECTION IDENTIFICATION IN MULTI-TERMINAL MIXED LINES

FIELD OF THE INVENTION

The present invention generally relates to fault section identification in multi-terminal mixed lines.

BACKGROUND OF THE INVENTION

In power transmission lines, auto-reclosure (or auto-reclose) is referred to as the automatic closing of a switching device (e.g. a circuit breaker) in order to restore service in transmission lines. It is performed following the tripping of the switching device due to a fault on the protected line. Since a significant number of the faults on overhead transmission lines are temporary faults, auto-reclosing can be used to quickly re-energize the line and restore service.

Certain considerations are to be taken with respect to the auto-reclosing function, especially in case of lines having underground cables. As faults in underground cables tend to be permanent, it is important that auto-reclosure is not done for underground cables. Auto-reclosing, when the fault is on the cable, can cause damage to the power cable and equipment such as circuit breaker, substation transformer and/or the nearby parts of the power system by subjecting them to additional stress.

Special consideration has to be taken for auto-reclosure in mixed lines. A mixed power transmission line (mixed line) is a transmission line with non-uniform line impedance characteristics. In other words, a mixed line has at least two line sections, wherein impedance characteristic (e.g. surge impedance) of one section is different from impedance characteristic of the other section(s). Selective auto-reclosure can be done for such lines only if it can be determined if the fault is on the cable portion or on the overhead line portion. This makes fault section identification (FSI) critical in these systems.

FSI becomes even more relevant and critical for multi-terminal mixed lines (e.g. a three-terminal or tapped line). In such lines, faults can happen in an overhead line, an underground cable, or at a junction between overhead line(s) and/or cables. Also, some faults (e.g. faults as a result of lightning) on the overhead line can cause damages to other parts of the line (e.g. insulation breakdown/cable termination damages).

Additionally, in multi-terminal mixed lines, the number of overhead line sections is typically more than the number of underground cable sections. Hence, for a reliable power system operation, accurate FSI is a need for selective tripping of the faulted section.

Fault location is an important parameter for reducing the maintenance time and increasing the system availability. In multi-terminal lines, the problem of accurate fault location becomes multi-fold due to incorrect FSI. Thus, FSI becomes a mandatory input for getting reliable fault location in multi-terminal mixed lines.

SUMMARY OF THE INVENTION

Various aspects of the invention relate to fault section identification in a multi-terminal mixed line. The mixed line connects three or more terminals (multi-terminal mixed line). For example, the mixed line can be a three terminal line connecting a first terminal, a second terminal and a third terminal. In such a three terminal line, there can be three sections and a junction (e.g. common junction (or tap) for the three sections), with a first section between the first terminal and the junction, a second section between the second terminal and the junction, and a third section between the third terminal and the junction.

The invention provides a method for fault section identification in the multi-terminal mixed line. For example, there may be an electrical fault in the multi-terminal mixed line due to disturbances like as bad weather, wind-borne debris etc. In such a case, a portion of the line or the entire line may be disconnected from the rest of power transmission network to prevent propagation of faults/damage to electrical equipment. The protection is enabled by controlling a switching device connected to the mixed line (e.g. through an Intelligent Electronic Device (IED)). Controlling the switching device includes operating the switching device to connect or disconnect the line. The switching device may be a circuit breaker, and the switching can be controlled with an auto-recloser.

The method is performed with one or more processors associated with controlling the switching device. For example, the method can be implemented by an IED having a processor. This may be an IED associated with one of a line section, a junction, a terminal etc. The IED receives one or more signals from one or more measurement equipment connected to the mixed line. For example, the measurement equipment can include a current transformer, a potential transformer, a sensor-based measurement equipment (e.g. Rogowski coils, non-conventional instrument transformers etc.) and/or the like, which provides a signal corresponding to current, voltage or other information as sensed from the mixed line. For example, a current transformer provides single/multiple phase current signal and a potential transformer can provide single/multiple phase voltage signal to the IED.

In an embodiment, the IED receives a signal(s) from the measurement equipment, and obtain measurements therefrom. In another embodiment, the measurement equipment publishes the measurements over a bus (e.g. process bus), and the IED (e.g. subscribed to receive data from such bus) receives the measurements over the bus.

In an embodiment, the method is implemented with a device for fault section identification in the multi-terminal mixed line, wherein the device has a plurality of modules. The plurality of modules can include, but need not be limited to, an input interface, a phasor calculation module, a fault section identification module and a trip module. Each module carries out one or more steps of the method. Further, the plurality of modules may be implemented using one or more processors. For instance, the one or more processors may be a processor of an IED.

The method may also be implemented with communication between a device associated with the multi-terminal mixed line, and a server. Here, some steps of the method may be performed with one or more processors of the server (e.g. calculations or use of models using measurements from various measurement equipment at various terminals of the multi-terminal mixed line), while the others are performed with one or more processors of the device (e.g. generation of re-trip signal for control of the switching device, through one or more processors of the device).

The method comprises obtaining positive sequence voltage and current phasors from measurements of voltages and currents at each terminal of the multi-terminal mixed line. It is to be noted that the phasors may be obtained from measurements at the device (e.g. received from a current/potential transformer at an IED of a terminal), or measurements received from other devices (e.g. other IEDs associated with other terminals). Here, a device (e.g. server) may collect current and voltage phasors from all IEDs in the network (e.g. over a communication channel).

The method further comprises calculating a voltage phasor for each terminal of the multi-terminal mixed line. The calculation of the voltage phasor for the first terminal is performed using at least the voltage and current phasors obtained for one of the second and third terminals, and the current phasor obtained for the first terminal.

The step of calculating the voltage phasor for the each terminal can include calculating two voltage phasors for the terminal. In such a case, a first voltage phasor for the first terminal is calculated using voltage and current phasors obtained for the second terminal, and a second voltage phasor for the second terminal is calculated using voltage and current phasors obtained for the third terminal. Here, one of the two calculated voltage phasors is selected for the terminal based on a comparison of the calculated and obtained voltage phasors. For example, the voltage phasor for which the difference between the calculated and obtained value is the lowest amongst the two is selected. Similarly, the voltage phasors can be calculated for the other terminals.

In an embodiment, calculating the voltage phasor for the first terminal comprises calculating a voltage phasor at the junction based on the voltage and current phasors obtained for the second terminal, and impedance characteristics of the section connecting the second terminal with the junction. Thereafter, the voltage phasor for the first terminal is calculated based on the voltage phasor calculated for the junction, the current phasor obtained for the first terminal, and impedance characteristics of the section connecting the first terminal with the junction. Such calculation may also be based on the voltage and current phasors obtained for the third terminal (in place of the second terminal).

In addition, the method comprises determining a section of the multi-terminal mixed line having the fault, based on the comparison of the calculated and obtained voltage phasors for each terminal. In an embodiment, determining the section with the fault comprises comparing the difference between the calculated and obtained voltage phasors for each terminal. Consider a case where the difference for each terminal is less than a threshold. In such a case, the fault may be determined to be at the junction. In an embodiment, the terminal for which the difference between the calculated and obtained voltage phasors is the lowest among all, can be identified as healthy or non-faulty sections, and conclude that other section as fault. For example, if the terminal A voltage calculated from terminal B is almost equal to the measured voltage at terminal A (difference is lowest), the fault can be identified on section CJ (that is between terminal C and junction). In another embodiment, the section associated with the terminal for which the difference between the calculated and obtained voltage phasors is the highest among all, can be identified as the section with the fault.

In an embodiment, the method comprises determining a location of the fault according to the determined section, wherein the calculated voltage and current phasors for the corresponding terminal are used for determining location of the fault.

The method can also comprise controlling the switching device with a re-trip signal (trip signal generated after tripping with a switching device like circuit breaker) for protecting the multi-terminal mixed line, wherein the re-trip signal is generated based on the determination of the section with the fault. The re-trip signal is associated with an auto-reclose function, and the re-trip signal is generated in response to determining that the section with the fault is an overhead line section. In other words, the auto-reclose function is enabled only when it is determined that the fault is in an overhead line section, and not enabled (blocked) when it is determined that the fault is in an underground cable. This re-trip signal may be generated with an IED (e.g. IED at the first terminal) for controlling the associated switching device (e.g. circuit breaker).

BRIEF DESCRIPTION OF DRAWINGS

The subject matter of the invention will be explained in more detail in the following text with reference to exemplary embodiments which are illustrated in attached drawings in which.

DETAILED DESCRIPTION

Various aspects of the present invention relate to fault section identification in a mixed line. Here, the mixed line is a multi-terminal line (multi-terminal mixed line), wherein the mixed line has three or more terminals.

Figure 1:
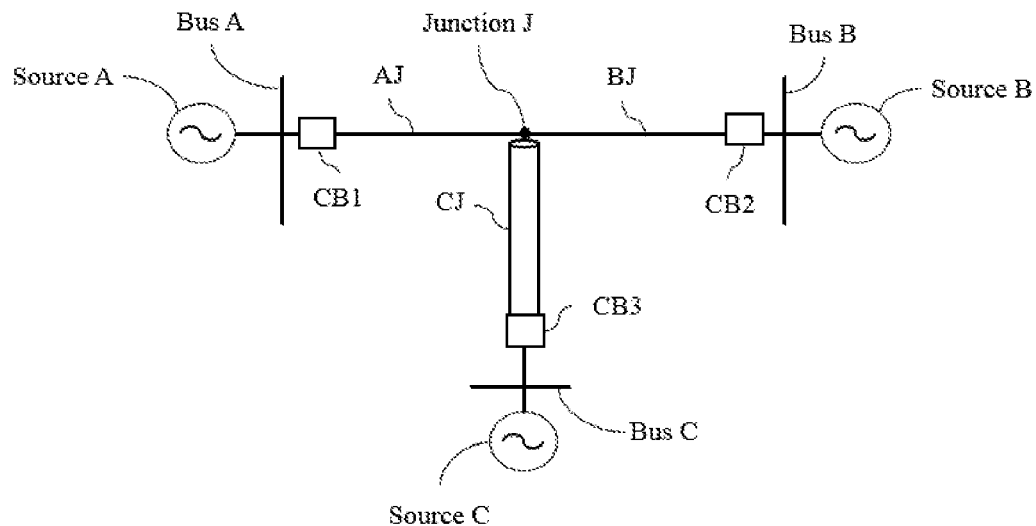
FIG. 1 is a simplified representation of a multi-terminal mixed line, in accordance with an embodiment of the invention.

Referring to FIG. 1, which illustrates a multi-terminal mixed line (also referred as tapped line) connecting three terminals in accordance with an embodiment of the invention. The line shown in FIG. 1 is a three terminal line, having three terminals and one junction. Bus A, Bus B and Bus C are the three terminals and J is the junction. There could also be more than one junction (e.g. two or more) in case of multiple line sections between the terminals (not shown in FIG. 1). For example, there could be an overhead line section, followed by a cable and another overhead line section between two terminals. In such a case, there could be two junctions.

The invention provides a method for fault section identification. The identification is performed in response to a fault in the multi-terminal mixed line. The section identification information is used for controlling a switching device connected to the multi-terminal mixed line. Controlling the switching device includes operating the switching device to connect or disconnect the line. The switching device may be a circuit breaker, and the switching can be controlled with an auto-recloser. For example, the switching device may be a circuit breaker such as CB1 or CB2 connected with overhead line sections as shown in FIG. 1.

Figure 2:
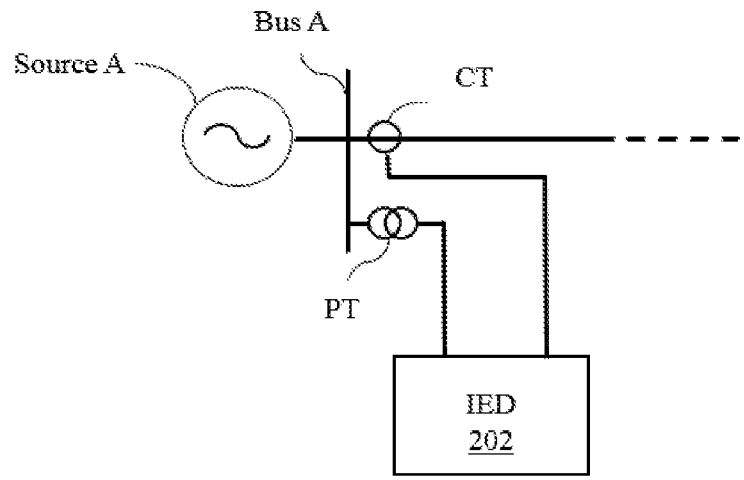
FIG. 2 is a simplified representation of a connection of an intelligent electronic device for obtaining measurements from the mixed line, in accordance with an embodiment of the invention.

The method is performed with one or more processors associated with controlling the switching device. For example, the method can be implemented by an IED with a processor. This may be an IED associated with one of a line section, a junction, a terminal etc. An example is illustrated in FIG. 2, wherein the IED (202) is associated with Bus A. The IED receives one or more signals from one or more measurement equipment connected to the multi-terminal mixed line. In the example of FIG. 2, a current transformer (CT) provides single/multiple phase current signal and a potential transformer (PT) provides single/multiple phase voltage signal to the IED.

In an embodiment the IED receives a signal(s) from the measurement equipment, and obtain measurements therefrom. In another embodiment, the measurement equipment publishes the measurements over a bus (e.g. process bus), and the IED (e.g. subscribed to receive data from such bus) receives the measurements over the bus.

Figure 3:
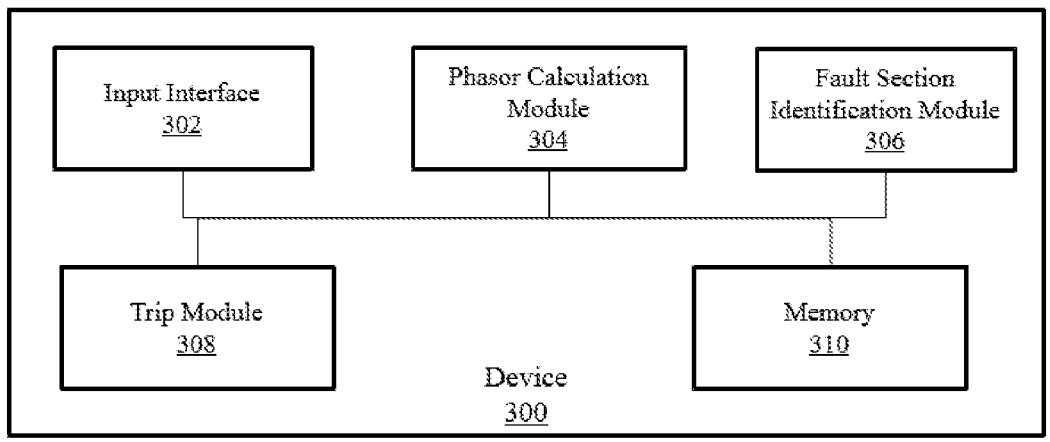
FIG. 3 is a simplified block diagram of a device for fault section identification, in accordance with an embodiment of the invention.

In an embodiment, the method is implemented with a device for fault section identification in the multi-terminal mixed line, wherein the device has a plurality of modules. FIG. 3 is a simplified block diagram of the device. In accordance with the embodiment illustrated in FIG. 3, the plurality of modules include an input interface (302), a phasor calculation module (304), a fault section identification module (306), a trip module (308) and a memory (310).

In accordance with various embodiments of the invention, each module of the device carries out one or more steps of the method (described herein after in conjunction with description of FIG. 3). Further, the plurality of modules may be implemented using one or more processors. For instance, the one or more processors may be a processor of an IED (e.g. IED 202).

The method may also be implemented with communication between a device associated with the mixed line, and a server. Here, some steps of the method may be performed with one or more processors of the server (e.g. calculations or use of models using measurements from various measurement equipment at various terminals of the mixed line), while the others are performed with one or more processors of the device (e.g. generation of re-trip signal for control of the switching device, through one or more processors of the device).

Figure 4:
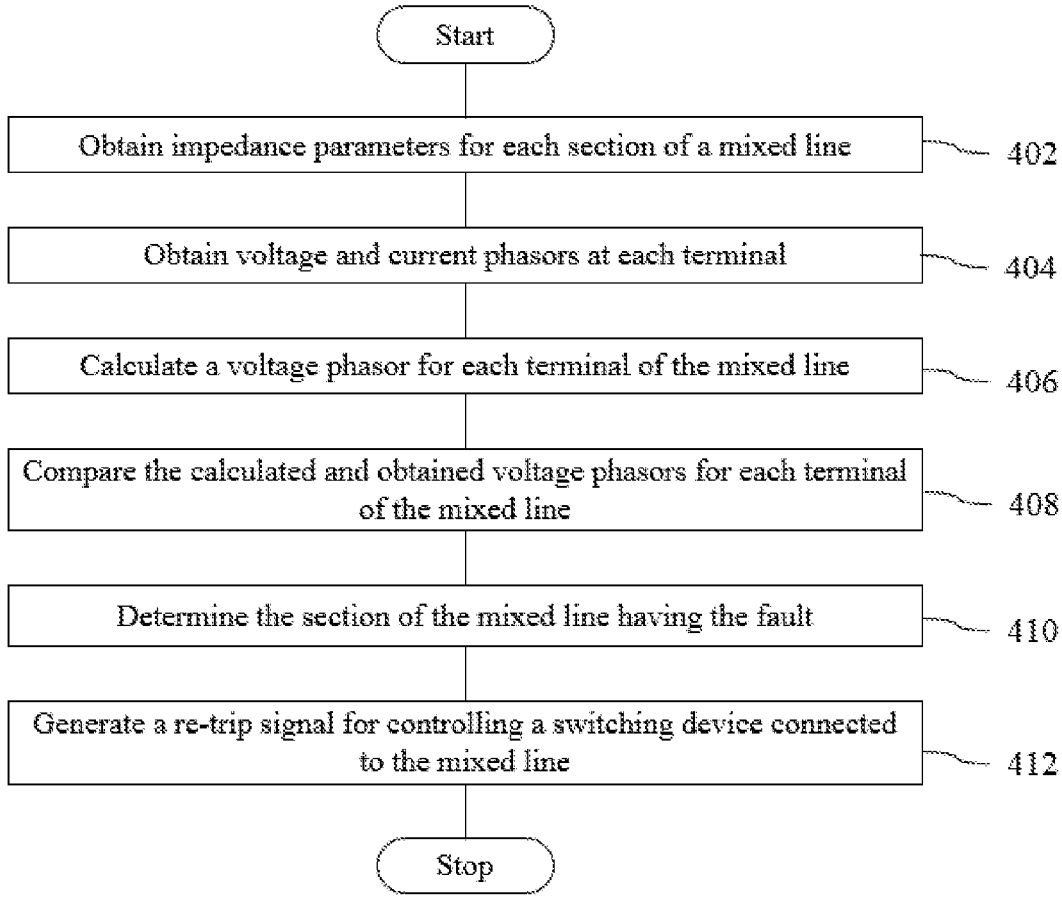
FIG. 4 is a flowchart of a method for fault section identification, in accordance with an embodiment of the invention.

Referring to FIG. 4, which illustrates a flowchart of the method for fault section identification, in accordance with an embodiment. At 402, the method comprises obtaining impedance parameters associated with each section of the mixed line. As shown in FIG. 1, assume:

Section AJ is an overhead line of length L1 km,
Section BJ is an overhead line of length L2 km, and
Section CJ is an underground cable of length L3 km.
Further, assume that:
$ABCD_{AJ}$ denotes the positive sequence line impedance parameters (ABCD matrix) of section AJ,
$ABCD_{BJ}$ denotes positive sequence line impedance parameters of section BJ, and
$ABCD_{CJ}$ denotes positive sequence line impedance parameters of section CJ.

Such impedance parameters are obtained at 302. Further, the parameters may be known before-hand, and stored in a memory associated with a processor associated with controlling the switching device. For example, this may be with IED 202 (e.g. in a memory thereof), or the device of FIG. 3 (e.g. in memory 310).

At 404, the method comprises obtaining positive sequence voltage and current phasors from measurements of voltages and currents at each terminal of the multi-terminal mixed line. Such phasors may be obtained using a suitable phasor calculation such as, but not limited to, Fourier calculations. For example, from the calculated voltage phasors, positive sequence quantities are computed using following transformation matrix:

$$\begin{bmatrix} V_{a0} \\ V_{a1} \\ V_{a2} \end{bmatrix} = \frac{1}{3} \begin{bmatrix} 1 & 1 & 1 \\ 1 & a & a^2 \\ 1 & a^2 & a \end{bmatrix} \begin{bmatrix} V_a \\ V_b \\ V_c \end{bmatrix}$$

where, $$a = e^{j120^0} = -\frac{1}{2} + j\frac{\sqrt{3}}{2}.$$

The phasors for each terminal may be obtained using an IED associated with the corresponding terminal (e.g. IED 202 for Bus A). In some embodiments, the phasors obtained for each terminal are communicated and stored (e.g. with IED 202 (e.g. in a memory thereof), or the device of FIG. 3 (e.g. in memory 310).

The method further comprises calculating a voltage phasor for each terminal of the mixed line at 406. The calculation of the voltage phasor for a terminal is performed using voltage and current phasors obtained for another terminal, and the current phasor obtained for the same terminal. For example, in case of three terminal line with a first terminal, a second terminal and a third terminal, the voltage phasor for the first terminal can be calculated using the voltage and current phasors obtained for the second terminal, and the current phasor obtained the first terminal. Here, in place of using the voltage and current phasors obtained for the second terminal, voltage and current phasors obtained for the third terminal may be used. Alternately, two voltage phasors can be calculated using the second and third terminal measurements along with the first terminal measurements, and one of the two selected.

In an embodiment, calculating the voltage phasor for the first terminal comprises calculating a voltage phasor at the junction based on the voltage and current phasors obtained for the second terminal, and impedance characteristics of the section connecting the second terminal with the junction. Thereafter, the voltage phasor for the first terminal is calculated based on the voltage phasor calculated for the junction, the current phasor obtained for the first terminal, and impedance characteristics of the section connecting the first terminal with the junction.

The following provides an example of calculation of a voltage phasor at each terminal of the three terminal line shown in FIG. 1.

Assume that:
$V_{Ameasured}^1$, $I_{Ameasured}^1$ are the positive sequence voltage and current phasors from measurements of voltages and currents at Bus A post the fault,
$V_{Bmeasured}^1$, $I_{Bmeasured}^1$ are the positive sequence voltage and current phasors from measurements of voltages and currents at Bus B post the fault, and
$V_{Cmeasured}^1$, $I_{Cmeasured}^1$ are the voltage and current phasors from measurements of positive sequence voltages and currents at Bus C post the fault.

Now, in order to calculate a voltage phasor for a second terminal (Bus B), we first calculate a voltage phasor at the junction J from voltage and current phasors obtained for the first terminal (Bus A); and section AJ impedance parameters, as shown in equations (A.1) and (A.2):

$$\begin{bmatrix} V_{JA}^1 \\ I_{JA}^1 \end{bmatrix} = inv\begin{bmatrix} A_{AJ}^1 & B_{AJ}^1 \\ C_{AJ}^1 & D_{AJ}^1 \end{bmatrix} * \begin{bmatrix} V_A^1 \\ I_A^1 \end{bmatrix} = \begin{bmatrix} -D_{AJ}^1 & B_{AJ}^1 \\ C_{AJ}^1 & -A_{AJ}^1 \end{bmatrix} * \begin{bmatrix} V_A^1 \\ I_A^1 \end{bmatrix} \quad (A.1)$$

$$V_{1A}^1 = -D_{AJ}^{1*}V_A^1 + B_{AJ}^{1*}J_A^1 A \quad (A.2)$$

Where, $V_{JA}^1$ and $I_{JA}^1$ are respectively voltage at the junction and current at the junction on section AJ.

Now, using the voltage phasor calculated for the junction, the current phasor measured at the second terminal (Bus B), and impedance parameters of section BJ, lets calculate a voltage phasor, as shown in equation (A.3):

$$\begin{bmatrix} V^1_{JB} \\ I^1_{JB} \end{bmatrix} = inv \begin{bmatrix} A^1_{BJ} & B^1_{BJ} \\ C^1_{BJ} & D^1_{BJ} \end{bmatrix} * \begin{bmatrix} V^1_{Bcalculated} \\ I^1_B \end{bmatrix} = \begin{bmatrix} -D^1_{BJ} & B^1_{BJ} \\ C^1_{BJ} & -A^1_{BJ} \end{bmatrix} * \begin{bmatrix} V^1_{Bcalculated} \\ I^1_B \end{bmatrix} \quad (A.3)$$

Rearranging equation (A.3), we have, $$V^1_{Bcalculated} = \frac{V^1_{JB} - B^1_{BJ} * I^1_B}{-D^1_{B1}} \quad (A.4)$$

Since junction estimated voltage from healthy section are equal, substituting equation (A.2) in equation (A.4), $$V^1_{Bcalculated} = \frac{D^1_{AJ} * V^1_A - B^1_{AJ} * I^1_A + B^1_{BJ} * I^1_B}{D^1_{BJ}} \quad (A.5)$$

$V^1_{Bcalculated}$ provides the voltage phasor at the second terminal. In equation (A.1),
$D^1_{AJ}$ and $B^1_{AJ}$ are positive sequence impedance parameter of section AJ $D_{AJ}^1 = \cos h(\gamma_1 dL_1)$ $B_{AJ}^1 = -Z_{c1} \sin h(\gamma_1 dL_1)$ $Z_{c1} = \sqrt{(r1+j\omega l1)/(j\omega c1)}$ $\gamma_1 = \sqrt{(r1+j\omega l1)(j\omega c1)}$ r1, l1 and c1 are resistance, inductance and capacitance per unit length of the section AJ,
$V_A^1$, $I_A^1$ are the positive sequence voltage and current from measurements at Bus A and,
$D_{BJ}^1$ and $B_{BJ}^1$ is the positive sequence impedance parameter of section BJ $D_{BJ}^1 = \cos h(\gamma_2 dL_2)$ $B_{BJ}^1 = -Z_{c2} \sin h(\gamma_2 dL_2)$ $Z_{c2} = \sqrt{(r2+j\omega l2)/(j\omega c2)}$ $\gamma_2 = \sqrt{(r2+j\omega l2)(j\omega c2)}$ r2, l2 and c2 are resistance, inductance and capacitance per unit length of the section BJ.
$I_B^1$ is the positive sequence current from measurements at Bus B
$V^1_{Bcalculated}$ is the positive sequence voltage calculated at Bus B.

In a similar manner, the voltage phasor for the third terminal (Bus C) can be calculated using the following equation (A.6):

$$V^1_{Ccalculated} = \frac{D^1_{BJ} * V^1_B - B^1_{BJ} * I^1_B + B^1_{CJ} * I^1_C}{D^1_{CJ}} \quad (A.6)$$

In equation (A.6),
$D_{BJ}^1$ and $B_{BJ}^1$ is the positive sequence impedance parameter of section BJ $D_{BJ}^1 = \cos h(\gamma_2 dL_2)$ $B_{BJ}^1 = -Z_{c2} \sin h(\gamma_2 dL_2)$ $Z_{c2} = \sqrt{(r2+j\omega l2)/(j\omega c2)}$ $\gamma_2 = \sqrt{(r2+j\omega l2)(j\omega c2)}$ r2, l2 and c2 are resistance, inductance and capacitance per unit length of the section BJ.
$V_B^1$, $I_B^1$ are the positive sequence voltage and current from measurements at Bus B
$D_{CJ}^1$ and $B_{CJ}^1$ is the positive sequence impedance parameter of section CJ $D_{CJ}^1 = \cos h(\gamma_3 dL_3)$ $B_{CJ}^1 = -Z_{c3} \sin h(\gamma_3 dL_3)$ $Z_{c3} = \sqrt{(r3+j\omega l3)/(j\omega c3)}$ $\gamma_3 = \sqrt{(r3+j\omega l3)(j\omega c3)}$ r3, l3 and c3 are resistance, inductance and capacitance per unit length of the section CJ.
$I_C^1$ is the positive sequence current from measurements at Bus C
$V^1_{Ccalculated}$ is the positive sequence voltage calculated at Bus C.

In a similar manner, the voltage phasor for the first terminal (Bus A) can be calculated using the following equation (A.7):

$$V^1_{Acalculated} = \frac{D^1_{CJ} * V^1_C - B^1_{CJ} * I^1_C + B^1_{AJ} * I^1_A}{D^1_{AJ}} \quad (A.7)$$

In equation (A.7),
$D_{CJ}^1$ and $B_{CJ}^1$ is the positive sequence impedance parameter of section CJ $D_{CJ}^1 = \cos h(\gamma_3 dL_3)$ $B_{CJ}^1 = -Z_{c3} \sin h(\gamma_3 dL_3)$ $Z_{c3} = \sqrt{(r3+j\omega l3)/(j\omega c3)}$ $\gamma_3 = \sqrt{(r3+j\omega l3)(j\omega c3)}$ r3, l3 and c3 are resistance, inductance and capacitance per unit length of the section CJ.
$V_C^1$, $I_C^1$ are the positive sequence voltage and current from measurements at Bus C
And, $D_{AJ}^1$ and $B_{AJ}^1$ is the positive sequence impedance parameter of section AJ $D_{AJ}^1 = \cos h(\gamma_1 dL_1)$ $B_{AJ}^1 = -Z_{c1} \sin h(\gamma_1 dL_1)$ $Z_{c1} = \sqrt{(r1+j\omega l1)/(j\omega c1)}$ $\gamma_1 = \sqrt{(r1+j\omega l1)(j\omega c1)}$ r1, l1 and c1 are resistance, inductance and capacitance per unit length of the section AJ, $I_A^1$ is the positive sequence current from measurements at Bus A $V_{Acalculated}^1$ is the positive sequence voltage calculated at Bus A.

Referring back to FIG. 4, the step 406 of calculating the voltage phasor for each terminal can be performed with the IED associated with the terminal (e.g. with IED 202), or with the phasor calculation module (304) of the device.

The method further comprises determining the section with the fault at 408. The section of the mixed line with the fault is determined based on the comparison of the calculated and obtained voltage phasors for each terminal.

In an embodiment, determining the section with the fault comprises comparing the difference between the calculated and obtained voltage phasors for each terminal. For example, the difference between the calculated and obtained voltage phasors is compared with a threshold value (e.g. determined from system parameters such as grounding and fault resistance).

Consider a case where the difference for each terminal is less than a threshold (e.g. all three comparisons less than 0.05% of the system voltage). In such a case, the fault may be determined to be at the junction.

In an embodiment, the terminal for which the difference between the calculated and obtained voltage phasors is the lowest among all, can be identified as healthy or non-faulty sections, and conclude that other section as fault. For example, if the terminal A voltage calculated from terminal B is almost equal to the measured voltage at terminal A (difference is lowest), the fault is on section CJ (that is between terminal C and junction).

In another embodiment, the terminal for which the difference between the calculated and obtained voltage phasors is the highest among all, can be identified as the section with the fault.

As an example, the difference between the calculated and the obtained voltage phasors are calculated using the following equations (A.8) to (A.10):

$$[\Delta V_{B2A}] = |V_{B\_calculated}^1 - V_B^1| \quad (A.8)$$

$$[\Delta V_{C2B}] = |V_{C\_calculated}^1 - V_C^1| \quad (A.9)$$

$$[\Delta V_{A2C}] = |V_{A\_calculated}^1 - V_A^1| \quad (A.10)$$

In case of the three terminal line shown in FIG. 1, the fault may be at the junction, or in section AJ, section BJ, or section CJ. In accordance with the example, consider the following cases.

Case 1: Fault at the Junction:

If the fault is at a section, the calculated voltages at all three terminals should be equal to the respective measured voltages. That is $\Delta V_{B2A}$, $\Delta V_{A2C}$ and $\Delta V_{C2B}$ should be equal to (or close to) zero. Hence, if $\Delta V_{B2A}$, $\Delta V_{A2C}$ and $\Delta V_{C2B}$ are less than a small threshold value (c), the fault is identified to be at the junction.

Case 2: Fault in Section AJ:

If the fault is in section AJ, $V_{C\_calculated}^1$ calculated from Bus B and Bus C measurements is equal to (or substantially equal to) the measured value $V_C^1$. That is, $\Delta V_{C2B}$ will be zero (or close to zero).

Case 3: Fault in Section BJ:

Similarly, if fault is in section BJ, $V_{A\_calculated}^1$ calculated from Bus C and Bus A measurements is equal to (or almost equal to) the measured value $V_A^1$. That is, $V_{A2C}$ is zero (or close to zero).

Case 4: Fault in Section CJ:

Likewise, if the fault is in section CJ, $V_{B\_calculated}^1$ calculated from Bus A and B measurements is equal to (or almost equal to) the measured value $V_{Bd}^1$. That is, $\Delta V_{B2A}$ is zero (or close to zero).

In summary, for the above cases, the following conditions are true,

If $\Delta V_{B2A}$, $\Delta V_{A2C}$ and $\Delta V_{C2B} < \epsilon$, then the fault is at the junction If $\Delta V_{C2B}$ is minimum of $\Delta V_{C2B}$, $\Delta V_{A2C}$ and $\Delta V_{B2A}$, then section AJ (overhead line) has the fault If $\Delta V_{A2C}$ is minimum of $\Delta V_{C2B}$, $\Delta V_{A2C}$ and $\Delta V_{B2A}$, then section BJ (overhead line) has the fault If $\Delta V_{B2A}$ is minimum of $\Delta V_{C2B}$, $V_{A2C}$ and $\Delta V_{B2A}$, then section CJ (underground cable) has the fault In addition to the three comparisons shown in equations (A.8), (A.9) and (A.10), three more comparisons can be done to improve the robustness of the solution.

Equation (A.8) shows comparison of Bus B voltage calculated from Bus A to the measured value. In addition to this, Bus B voltage calculated from Bus C can also be calculated and compared to the measured value.

Similarly, Equation (A.9) shows comparison of Bus C voltage calculated from Bus B to the measured value. In addition to this, Bus C voltage calculated from Bus A can also be calculated and compared to the measured value.

Likewise, Equation (A.10) shows comparison of Bus A voltage calculated from Bus C to the measured value. In addition to this, Bus A voltage calculated from Bus B can also be calculated and compared to the measured value (Table 1)

TABLE 1

| | calculated from measured voltages at terminals | | |
|---|---|---|---|
| | A | B | C |
| VA_calculated | | ✓ | ✓ |
| VB_calculated | ✓ | | ✓ |
| VC_calculated | ✓ | ✓ | |

Hence, this would in total give six comparisons between measured and calculated voltages at all buses and the minimum of these can be used to identify the faulted section.

This is advantageous in cases where any of the buses have bad measurements. These redundant calculations help in obtaining the correct solution even when any of the buses have bad measurements or data synchronization issues.

Thus, by comparing the calculated and obtained voltage phasors for each terminal, the section with the fault can be identified. This step can be performed with the IED associated with the terminal (e.g. with IED 202), or with the fault section identification module (306) of the device.

The method further comprises controlling the switching device with a re-trip signal for protecting the mixed line at 410. The re-trip signal is generated for controlling the associated switching device (e.g. circuit breaker) based on the determination of the section with the fault. The re-trip signal is associated with an auto-reclose function, and the re-trip signal is generated in response to determining that the section with the fault is an overhead line section (for example, section AJ or BJ shown in FIG. 1).

In other words, the auto-reclose function is enabled only when it is determined that the fault is in an overhead line section, and not enabled (blocked) when it is determined that the fault is in an underground cable. This re-trip signal may be generated with an IED (e.g. IED at the first terminal) the IED associated with the terminal (e.g. with IED 202), or with the trip module (308) of the device.

The method may also be implemented with communication between a device associated with the mixed line, and a server. Here, some steps of the method may be performed with one or more processors of the server (e.g. 404, 406, 408, 410), while the others (412) are performed with one or more processors of the device.

Thus, the invention provides for selective auto-reclosing based on FSI for multi-terminal lines.

The invention claimed is:

1. A method for fault section identification in a mixed line, wherein the mixed line connects three or more terminals and wherein the mixed line comprises three or more sections with at least one overhead line section and at least one underground cable, the method being performed with one or more processors associated with controlling a switching device connected to the mixed line, the method comprising:
    obtaining positive sequence voltage and current phasors from measurements of voltages and currents at each terminal of the mixed line;
    calculating a voltage phasor for each terminal of the mixed line, wherein the calculation of the voltage phasor for a first terminal is performed using at least the voltage and current phasors obtained for one of a second terminal and a third terminal, and the current phasor obtained for the first terminal; and
    determining a section of the mixed line having the fault, based on a comparison of the calculated and obtained voltage phasors for each terminal; and
    controlling the switching device with a re-trip signal for protecting the mixed line, wherein the re-trip signal is generated based on the determination of the section with the fault.

2. The method of claim 1, wherein the step of calculating the voltage phasor for the each terminal comprises calculating two voltage phasors for the terminal and selecting one of the two calculated voltage phasors for the terminal based on a comparison of the calculated and obtained voltage phasors,
    wherein a first voltage phasor for the first terminal is calculated using voltage and current phasors obtained for the second terminal, and
    wherein a second voltage phasor for the second terminal is calculated using voltage and current phasors obtained for the third terminal.

3. The method of claim 1, wherein the mixed line connects the first, second and third terminals and comprises three sections connected at a junction, and wherein calculating the voltage phasor for the first terminal comprises:
    calculating a voltage phasor at the junction based on the voltage and current phasors obtained for the second terminal and impedance characteristics of the section connecting the second terminal with the junction; and
    calculating the voltage phasor at the first terminal based on the voltage phasor calculated for the junction, the current phasor obtained for the first terminal, and impedance characteristics of the section connecting the first terminal with the junction.

4. The method of claim 1, further comprising determining a location of the fault according to the determined section, wherein the calculated voltage and current phasors for the corresponding terminal are used for determining the location of the fault.

5. The method of claim 1, wherein the section with the fault is determined by comparing the difference between the calculated and obtained voltage phasors for each terminal.

6. The method of claim 5, wherein the fault is determined to be at the junction if the difference between the calculated and obtained voltage phasors for each terminal is less than a threshold.

7. The method of claim 1, wherein the re-trip signal is associated with an auto-reclose function and wherein the re-trip signal is generated in response to determining that the section with the fault is an overhead line section.

8. A device for fault section identification in a mixed line, wherein the mixed line connects three or more terminals and wherein the mixed line comprises three or more sections with at least one overhead line and at least one underground cable, the device comprising:
    an input interface for obtaining positive sequence voltage and current phasors from measurements of voltages and currents carried out at each terminal of the mixed line;
    a phasor calculation module for calculating a voltage phasor for each terminal of the mixed line, wherein the calculation of the voltage phasor at a first terminal is performed using at least the voltage and current phasors obtained for one of a second terminal and a third terminal and the current phasor obtained for the first terminal;
    a fault section identification module for determining a section of the mixed line having the fault, based on a comparison of the calculated and obtained voltage phasors for each terminal; and
    a trip module for controlling a switching device connected to the mixed line with a re-trip signal, wherein the re-trip signal is generated based on the determination with the fault section identification module, for protecting the mixed line.

* * * * *